United States Patent
Chen et al.

(10) Patent No.: US 12,015,033 B2
(45) Date of Patent: Jun. 18, 2024

(54) ARRAY SUBSTRATE AND METHOD FOR MANUFACTURING THE SAME, DISPLAY PANEL AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Wei Chen, Beijing (CN); Weixiong Chen, Beijing (CN); Xin Li, Beijing (CN); Yong Song, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 394 days.

(21) Appl. No.: 17/435,337

(22) PCT Filed: Dec. 30, 2020

(86) PCT No.: PCT/CN2020/141499
§ 371 (c)(1),
(2) Date: Aug. 31, 2021

(87) PCT Pub. No.: WO2021/190053
PCT Pub. Date: Sep. 30, 2021

(65) Prior Publication Data
US 2023/0178563 A1    Jun. 8, 2023

(30) Foreign Application Priority Data
Mar. 25, 2020 (CN) .......................... 202020399431.0

(51) Int. Cl.
*H01L 27/12* (2006.01)
*G02F 1/1362* (2006.01)
(Continued)

(52) U.S. Cl.
CPC ...... *H01L 27/124* (2013.01); *G02F 1/136286* (2013.01); *G02F 1/1368* (2013.01);
(Continued)

(58) Field of Classification Search
None
See application file for complete search history.

(56) References Cited

U.S. PATENT DOCUMENTS

2005/0263762 A1   12/2005 Kim
2012/0112197 A1   5/2012 Yoshida et al.
(Continued)

FOREIGN PATENT DOCUMENTS

CN   1618037 A    5/2005
CN   102473368 A  5/2012
(Continued)

OTHER PUBLICATIONS

The First Office Action of Priority Application No. CN 202020399431.0 issued by the Chinese Patent Office on Jul. 29, 2020.

*Primary Examiner* — Michael Lebentritt
(74) *Attorney, Agent, or Firm* — IP & T GROUP LLP

(57) ABSTRACT

An array substrate includes a base, a first conductive layer disposed at a side of the base, an insulating layer disposed at a side of the first conductive layer away from the base, and a second conductive layer disposed at a side of the insulating layer away from the first conductive layer. The insulating layer is provided with a first via hole exposing the first electrode of the first transistor and a second via hole exposing the first electrode of the second transistor. The second conductive layer includes a first conductive connection
(Continued)

portion, and the first conductive connection portion connects the first electrode of the first transistor and the first electrode of the second transistor through the first via hole and the second via hole.

17 Claims, 12 Drawing Sheets

(51) Int. Cl.
    *G02F 1/1368*     (2006.01)
    *G09G 3/36*     (2006.01)
    *G02F 1/1333*     (2006.01)
    *G11C 19/28*     (2006.01)

(52) U.S. Cl.
    CPC ........ *G09G 3/3622* (2013.01); *H01L 27/1259* (2013.01); *G02F 1/133331* (2021.01); *G09G 2300/0408* (2013.01); *G09G 2310/0281* (2013.01); *G09G 2310/0283* (2013.01); *G09G 2310/0286* (2013.01); *G09G 2320/0233* (2013.01); *G11C 19/28* (2013.01)

(56) References Cited

U.S. PATENT DOCUMENTS

| | | |
|---|---|---|
| 2012/0162179 A1 | 6/2012 | Tanaka et al. |
| 2015/0187810 A1 | 7/2015 | Lee |
| 2019/0043892 A1 | 2/2019 | Lee et al. |
| 2020/0004075 A1 | 1/2020 | Yoshida |
| 2020/0052005 A1 | 2/2020 | Yoshida |
| 2021/0157207 A1 | 5/2021 | Zhang et al. |
| 2022/0310772 A1* | 9/2022 | Qing .................... G09G 3/3225 |

FOREIGN PATENT DOCUMENTS

| | | | | |
|---|---|---|---|---|
| CN | 103346143 A | | 10/2013 | |
| CN | 104749805 A | | 7/2015 | |
| CN | 105549288 A | | 5/2016 | |
| CN | 109037242 A | * | 12/2018 | .......... G09G 3/3677 |
| CN | 109387986 A | | 2/2019 | |
| CN | 109782502 A | | 5/2019 | |
| CN | 110095889 A | | 8/2019 | |
| CN | 110326037 A | | 10/2019 | |
| CN | 110660368 A | | 1/2020 | |
| CN | 110660814 A | * | 1/2020 | |
| CN | 110890348 A | | 3/2020 | |
| CN | 211669478 U | | 10/2020 | |
| CN | 113871419 A | * | 12/2021 | |
| CN | 114724504 A | * | 7/2022 | |
| IN | 108182921 A | | 6/2018 | |
| WO | 2011/036911 A1 | | 3/2011 | |
| WO | WO-2021016745 A1 | * | 2/2021 | ......... G02F 1/13338 |
| WO | WO-2023000955 A1 | * | 1/2023 | |

* cited by examiner

US 12,015,033 B2

ARRAY SUBSTRATE AND METHOD FOR MANUFACTURING THE SAME, DISPLAY PANEL AND DISPLAY DEVICE

CROSS-REFERENCE TO RELATED APPLICATIONS

This application is a national phase entry under 35 USC 371 of International Patent Application No. PCT/CN2020/141499, filed on Dec. 30, 2020, which claims priority to Chinese Patent Application No. 202020399431.0, filed on Mar. 25, 2020, which is incorporated herein by reference in its entirety.

TECHNICAL FIELD

The present disclosure relates to the field of display technologies, and in particular, to an array substrate and a method for manufacturing the same, a display panel, and a display device.

BACKGROUND

With the development of display technologies, a frame of the display device is getting narrower and narrower, pixels per inch (PPI, i.e., the pixel density) is getting higher and higher, and wires of peripheral driving circuits are getting more and more complicated.

SUMMARY

In an aspect, an array substrate is provided. The array substrate has an active area and a non-active area adjacent to the active area. The array substrate includes a base, a first conductive layer disposed at a side of the base, an insulating layer disposed at a side of the first conductive layer away from the base, and a second conductive layer disposed at a side of the insulating layer away from the first conductive layer. A portion of the first conductive layer located in the non-active area includes at least a first electrode of a first transistor and a first electrode of a second transistor, there is a distance between the first electrode of the first transistor and the first electrode of the second transistor, and the first transistor and the second transistor are at least a part of a shift register of a same stage in a gate driving circuit. The insulating layer is provided with a first via hole exposing the first electrode of the first transistor and a second via hole exposing the first electrode of the second transistor. The second conductive layer includes a first conductive connection portion, and the first conductive connection portion connects the first electrode of the first transistor and the first electrode of the second transistor through the first via hole and the second via hole.

In some embodiments, the portion of the first conductive layer located in the non-active area further includes an output signal line and a common electrode block. The output signal line has a first end away from the active area and a second end proximate to the active area. The first end of the output signal line is coupled to a scanning signal output terminal of the shift register. The common electrode block is configured to transmit a common voltage signal. A distance between the common electrode block and the output signal line is in a range of about 22 μm to about 42 μm.

In some embodiments, the first conductive layer further includes a common voltage line and a gate line. The common voltage line extends from the active area to the non-active area, and an end portion of the common voltage line located in the non-active area is connected to the common electrode block. The gate line extends from the active area to the non-active area, and an end portion of the gate line located in the non-active area is coupled to the second end of the output signal line.

In some embodiments, the insulating layer is provided with a third via hole exposing the second end of the output signal line and a fourth via hole exposing the end portion of the gate line located in the non-active area. The second conductive layer further includes a second conductive connection portion, and the second conductive connection portion connects the end portion of the gate line located in the non-active area and the second end of the output signal line through the third via hole and the fourth via hole, so that the end portion of the gate line located in the non-active area is coupled to the second end of the output signal line.

In some embodiments, a distance between the end portion of the gate line located in the non-active area and the second end of the output signal line is in a range of about 5 μm to about 15 μm. Or, a distance between any two of the first end of the output signal line, the first electrode of the first transistor and the first electrode of the second transistor is in a range of about 5 μm to about 15 μm. Or, a distance between the end portion of the gate line located in the non-active area and the second end of the output signal line is in a range of about 5 μm to about 15 μm, and a distance between any two of the first end of the output signal line, the first electrode of the first transistor and the first electrode of the second transistor is in a range of about 5 μm to about 15 μm.

In some embodiments, a dimension of the common electrode block in a direction parallel to an edge of the active area is in a range of about 60 μm to about 80 μm.

In some embodiments, a portion of the second conductive layer located in the non-active area further includes an output signal line, and the output signal line has a first end away from the active area and a second end proximate to the active area. The first end of the output signal line is coupled to a scanning signal output terminal of the shift register.

In some embodiments, the first conductive layer further includes a gate line, and the gate line extends from the active area to the non-active area. The insulating layer is provided with a fifth via hole exposing an end portion of the gate line located in the non-active area. The second end of the output signal line is connected to an end portion of the gate line located in the non-active area through the fifth via hole.

In some embodiments, the shift register further includes a capacitor disposed on the base. A first electrode of the capacitor is coupled to the scanning signal output terminal of the shift register, and a second electrode of the capacitor is coupled to the first conductive connection portion.

In some embodiments, one of the first electrode of the capacitor and the second electrode of the capacitor is located in the first conductive layer, and another is located in the second conductive layer.

In some embodiments, the portion of the first conductive layer located in the non-active area further includes: a second electrode of the first transistor, a second electrode of the second transistor, a forward scan line, and a reverse scan line. The forward scan line is disposed around the active area, and the forward scan line is disposed at a side of the gate driving circuit away from the active area. The reverse scan line is disposed around the active area, and the reverse scan line is disposed at the side of the gate driving circuit away from the active area. The second electrode of the first transistor is connected to the forward scan line, or the second electrode of the second transistor is connected to the reverse scan line, or the second electrode of the first transistor is connected to the forward scan line and the second electrode of the second transistor is connected to the reverse scan line.

In another aspect, an array substrate is provided. The array substrate has an active area and a non-active area adjacent to the active area. The array substrate includes a base and a first conductive layer disposed at a side of the base. A portion of the first conductive layer located in the non-active area includes at least: an output signal line and a common electrode. The output signal line is configured to transmit a scanning voltage signal, and the common electrode block is configured to transmit a common voltage signal. A distance between the common electrode block and the output signal line is in a range of about 22 μm to about 42 μm.

In yet another aspect, a method for manufacturing an array substrate is provided. The array substrate has an active area and a non-active area adjacent to the active area. The method includes:

providing a base;

forming a first conductive layer at a side of the base, a portion of the first conductive layer located in the non-active area including at least a first electrode of a first transistor and a first electrode of a second transistor, there being a distance between the first electrode of the first transistor and the first electrode of the second transistor, and the first transistor and the second transistor being at least a part of a shift register of a same stage in a gate driving circuit;

forming an insulating layer at a side of the first conductive layer away from the base, and etching the insulating layer to form a first via hole exposing the first electrode of the first transistor and a second via hole exposing the first electrode of the second transistor; and forming a second conductive layer at a side of the insulating layer away from the first conductive layer, the second conductive layer including a first conductive connection portion, and the first conductive connection portion connecting the first electrode of the first transistor and the first electrode of the second transistor through the first via hole and the second via hole.

In yet another aspect, a method for manufacturing an array substrate is provided. The array substrate has an active area and a non-active area adjacent to the active area. The method includes: providing a base; and forming a first conductive layer at a side of the base. A portion of the first conductive layer located in the non-active area includes at least an output signal line and a common electrode block. The output signal line is configured to transmit a scanning voltage signal, and the common electrode block is configured to transmit a common voltage signal. A distance between the common electrode block and the output signal line is in a range of about 22 μm to about 42 μm.

In yet another aspect, a display panel is provided. The display panel includes a array substrate as described in any of the above embodiments, and a transparent cover plate disposed at a side of the array substrate.

In yet another aspect, a display device is provided. The display device includes the display panel as described in any of the above embodiments, and a power module. The power module is coupled to the array substrate in the display panel, and the power module is configured to supply power to the array substrate.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on an actual size of a product, an actual process of a method and an actual timing of a signal involved in the embodiments of the present disclosure.

DETAILED DESCRIPTION

Figure 1:
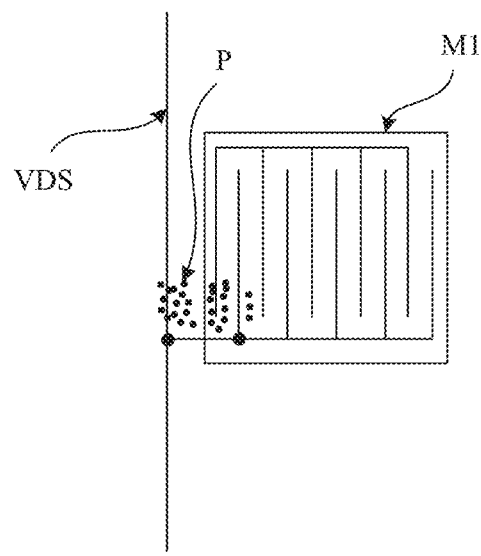
FIG. 1 is a structural diagram of an array substrate in the related art.

Technical solutions in some embodiments of the present disclosure will be described clearly and completely with reference to the accompanying drawings. Obviously, the described embodiments are merely some but not all embodiments of the present disclosure. All other embodiments obtained by a person of ordinary skill in the art on the basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment or example. In addition, the specific features, structures, materials, or characteristics may be included in any one or more embodiments or examples in any suitable manner.

Hereinafter, terms such as "first" and "second" are used for descriptive purposes only, and are not to be construed as indicating or implying relative importance or implicitly indicating the number of indicated technical features below. Thus, features defined as "first" or "second" may explicitly or implicitly include one or more of the features. In the description of the embodiments of the present disclosure, the term "a plurality of/the plurality of" means two or more unless otherwise specified.

In the description of some embodiments, the terms "coupled" and "connected" and their extensions may be used. For example, the term "connect" may be used in the description of some embodiments to indicate that two or more components are in direct physical contact or electrical contact with each other. For another example, the term "coupled" may be used in the description of some embodiments to indicate that two or more components are in direct physical contact or electrical contact. However, the term "coupled" or "communicatively coupled" may also mean that two or more components are not in direct contact with each other, but still cooperate or interact with each other. The embodiments disclosed herein are not necessarily limited to the contents herein.

Terms such as "about" or "approximately" as used herein includes a stated value and an average value within an acceptable deviation range of a particular value. The acceptable deviation range is, for example, determined by a person of ordinary skill in the art, considering measurement in question and errors associated with measurement of a particular quantity (i.e., limitation of a measurement system).

Peripheral driving circuits of a display device are located in a non-active area, and the peripheral driving circuits may include a gate driving circuit. Embodiments of the present disclosure are described by taking an example in which the gate driving circuit is integrated on an array substrate (i.e., Gate driver On Array, abbreviated as GOA).

In the display device, the gate driving circuit includes at least two cascaded shift registers, and the at least two shift registers are connected to different gate lines. By providing scanning signals to all gate lines row by row, the gate lines may be driven, thereby driving a display panel of the display device to achieve display.

Referring to FIG. 1, for example, each shift register includes a first transistor M1, and one electrode (e.g., a source or a drain) of the first transistor M1 is coupled to a forward scan line VDS. In the related art, as shown in FIG. 1, there are a large number of black dots P between the first transistor M1 and the forward scan line VDS, and a channel of an active layer of the first transistor M1 is abnormal. In this way, a phenomenon of virtual short circuit or damage is prone to occur between the first transistor M1 and the forward scan line VDS, thereby causing abnormal signal transmission between the first transistor M1 and the forward scan line VDS.

Figure 2:
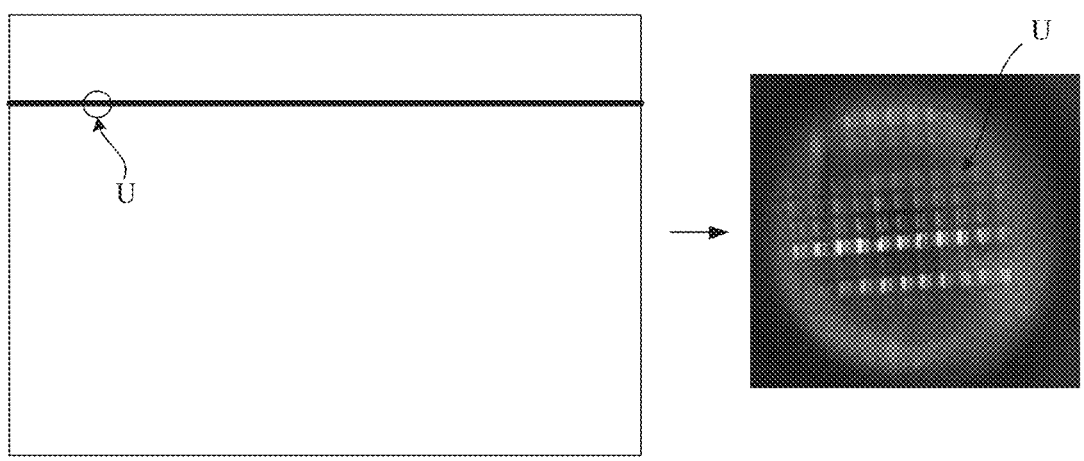
FIG. 2 is a structural diagram of a display device in the related art.

In the display device, each stage of shift register is used to drive one gate line (i.e., to drive a row of pixels to emit light). However, as shown in FIG. 2, due to the abnormal signal transmission, jitter horizontal stripes appear in an active area of a display device 00. It can be seen from an electron microscope image of the jitter horizontal stripe at a position U (referring to an electron microscope image at a lower right corner of FIG. 2) that, there are pixels that do not emit light and pixels that have darker brightness at the jitter horizontal stripe. That is, since there are a large amount of black dots between the first transistor M1 of the shift register and the forward scan line VDS (which causes the abnormal signal transmission), an entire row of pixels driven by the shift register do not emit light or the brightness thereof becomes dark, and thus the jitter horizontal stripe appears.

Figure 3A:
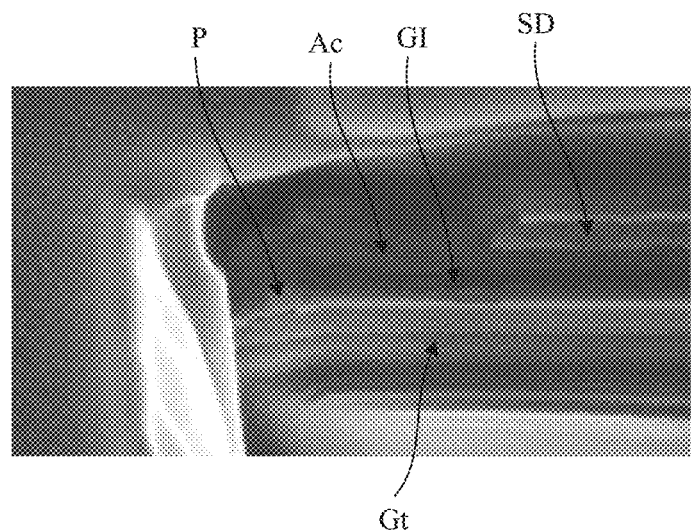
FIG. 3A is a cross-sectional view of black dots in an array substrate in the related art.
Figure 3B:
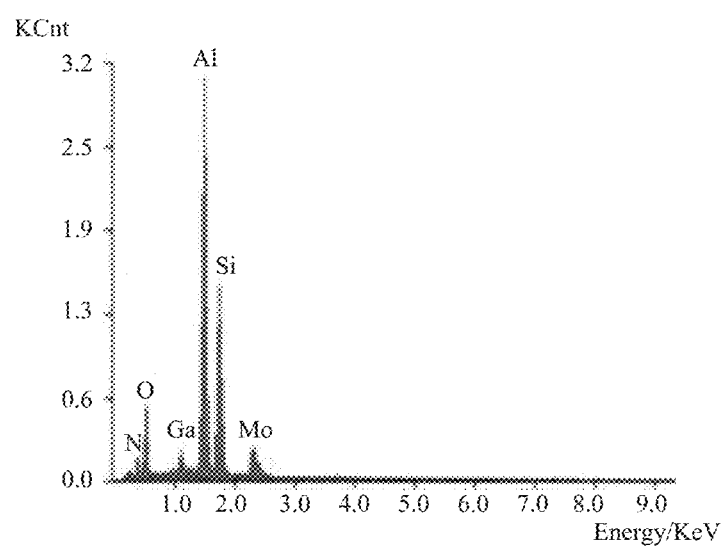
FIG. 3B is an energy spectrum diagram of black dots in an array substrate in the related art.

FIG. 3A shows a cross-sectional view of the black dot in the array substrate, and FIG. 3B shows an energy spectrum diagram of the black dot in the array substrate. As shown in FIG. 3A, the array substrate includes a gate layer Gt, a gate insulating to layer GI, an active layer Ac, and a source-drain metal layer SD that are sequentially stacked. The inventors of the present disclosure have discovered through research that, there is no obvious phenomenon in the source-drain metal layer SD and an insulating layer on it, and the black dots P appear at a side of the gate layer Gt proximate to the active layer Ac. With reference to FIG. 3B, it can be seen that the black dot P contains a large amount of Al, Si, etc. That is, composition of the black dot P is almost the same as composition of the gate layer Gt. Meanwhile, it can be seen from FIG. 3A that, a portion of the gate layer Gt located under the black dot P is missing. That is, metals (e.g., Al, Si) in this region are subjected to electromigration, thereby forming the black dot P. Moreover, the electromigration process occurs before depositing the source-drain metal layer SD and is progressive. Therefore, it is difficult to find and effectively intercept the electromigration during the manufacturing process, and the risk is high.

It will be noted that, a metal crystal is composed of regularly arranged ion lattice and free electrons. At a certain temperature, when a current density is large enough, aluminum ions are thermally activated by energy of electron stream and flow in a direction where the electrons flow. As a result, ions near an anode accumulate to form hillocks or whiskers, and cavities are formed near cathodes and grow, which causes films to fail. Such quality transmission is the electromigration.

Figure 4:
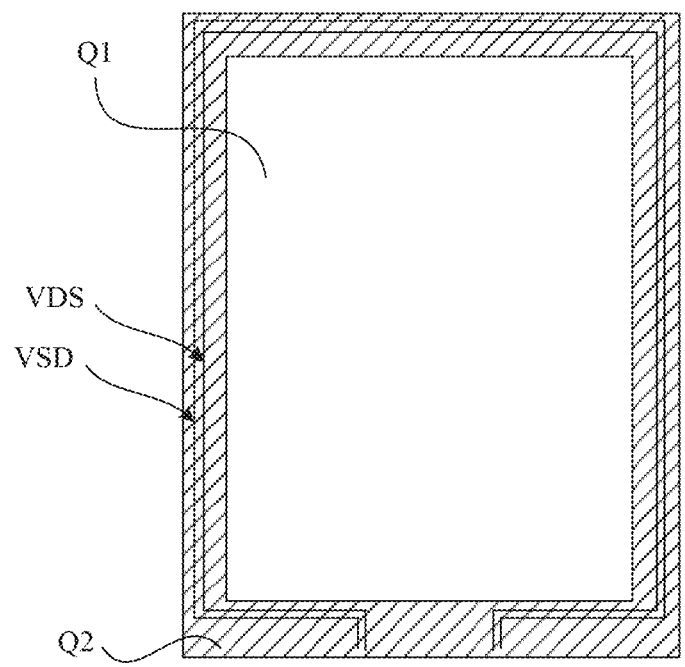
FIG. 4 is a structural diagram of an array substrate, in accordance with some embodiments of the present disclosure.

On this basis, some embodiments of the present disclosure provide an array substrate 10. As shown in FIG. 4, the array substrate 10 has an active area Q1 and a non-active area Q2 adjacent to the active area Q1. It will be noted that FIG. 4 only shows a possible array substrate 10. In practical applications, the active area Q1 and the non-active area Q2 may be of any shapes, and the non-active area Q2 adjacent to the active area Q1 may be only adjacent to some of an edge of the active area Q1, or may be adjacent to the entire edge of the active area Q1. For example, in FIG. 4, a shape of the active area Q1 may be a rectangle, and the non-active area Q2 may be adjacent to the entire edge of the rectangular active area Q1. That is, the non-active area Q2 may be disposed around the active area Q1.

Figure 5:
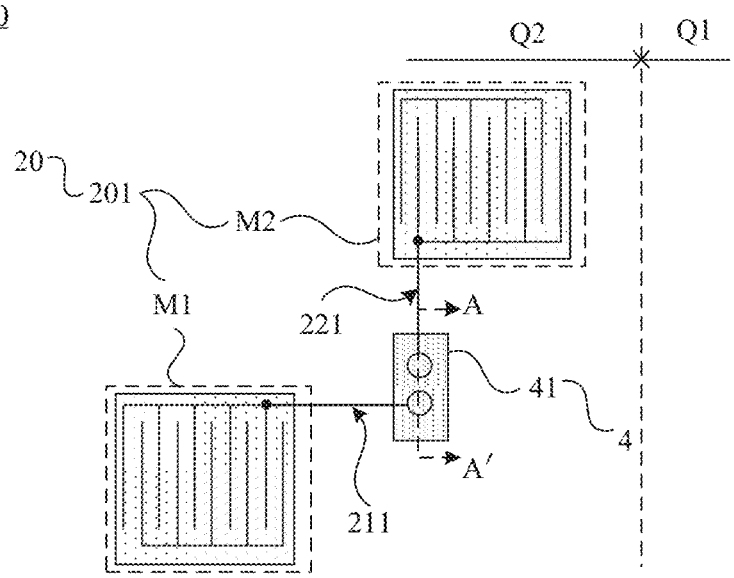
FIG. 5 is a structural diagram of an array substrate integrated with a gate driving circuit, in accordance with some embodiments of the present disclosure.
Figure 6:
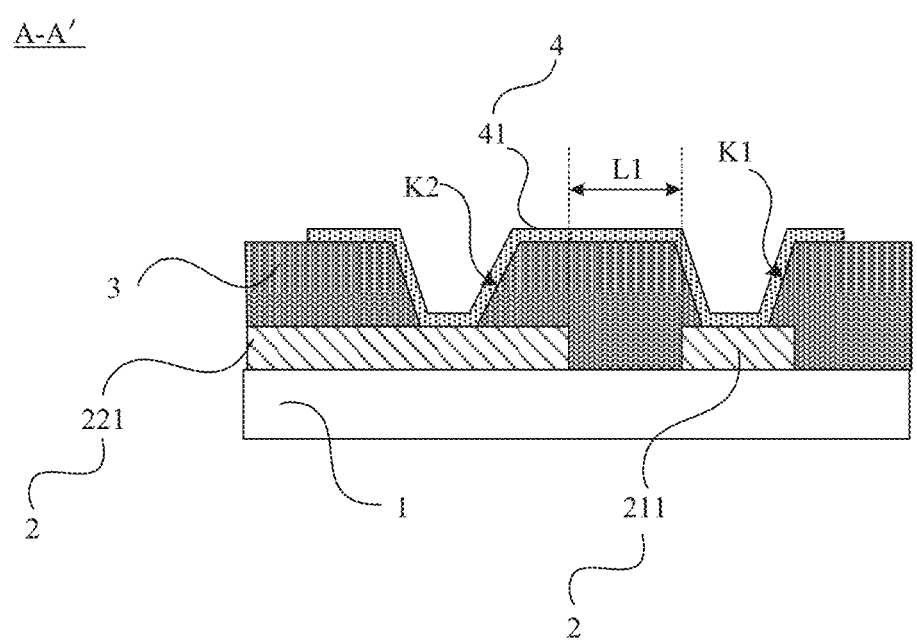
FIG. 6 is a sectional view of the array substrate integrated with the gate driving circuit in FIG. 5 at A-A'.

Referring to to FIGS. 5 and 6, the array substrate 10 includes a base 1, a first conductive layer 2 disposed at a side of the base 1, an insulating layer 3 disposed at a side of the first conductive layer 2 away from the base 1, and a second conductive layer 4 disposed at a side of the insulating layer 3 away from the first conductive layer 2. As shown in FIGS. 5 and 6, a portion of the first conductive layer 2 located in the non-active area Q2 includes at least a first electrode 211 of the first transistor M1 and a first electrode 221 of a second transistor M2. There is a distance L1 between the first electrode 211 of the first transistor M1 and the first electrode 221 of the second transistor M2, and the first transistor M1 and the second transistor M2 are at least a part of a shift register 201 of the same stage in a gate driving circuit 20. Herein, it will be noted that, the first transistor M1 and the second transistor M2 may be any two transistors in the shift register 201, which is not limited in the embodiments of the present disclosure. For example, referring to FIG. 7, in a case where the non-active area Q2 of the array substrate 10 is provided with the forward scan line VDS and the shift register 201 is located between the edge of the active area Q1 and the forward scan line VDS, the first transistor M1 may be a transistor proximate to the forward scan line VDS in the shift register 201, and the second transistor M2 may be a transistor proximate to the edge of the active area Q1 in the shift register 201. For another example, referring to FIG. 7, in a case where the non-active area Q2 of the array substrate 10 is provided with the forward scan line VDS and a reverse scan line VSD, the first transistor M1 may be a transistor coupled to the forward scan line VDS in the shift register 201 (e.g., in FIG. 7, a second electrode 212 of the first transistor M1 is coupled to the forward scan line VDS), and the second transistor M2 may be a transistor coupled to the reverse scan line VSD in the shift register 201 (e.g., in FIG. 7, a second electrode 222 of the second transistor M2 is coupled to the reverse scan line VSD).

The transistors used in all the embodiments of the present disclosure may be thin film transistors or field effect transistors or other devices with corresponding switching characteristics. Since a source a drain in a transistor are usually symmetrical in structure and composition, there is no difference between the source and drain. In the embodiments of the present disclosure, in order to distinguish two electrodes of the transistor except a gate, one of the two electrodes is referred to as a first electrode, and the other electrode is referred to as a second electrode. It can be understood that, in a case where any one of the first electrode and the second electrode is the source, the other is the drain. In addition, the transistors may be divided into N-type and P-type transistors according to their characteristics. The first transistor M1 in the embodiments of the present disclosure may be an N-type transistor or a P-type transistor, similarly, the second transistor M2 in the embodiments of the present disclosure may also be the N-type transistor or the P-type transistor.

With continued reference to FIG. 6, the insulating layer 3 is provided with a first via hole K1 exposing the first electrode 211 of the first transistor M1 and a second via hole K2 exposing the first electrode 221 of the second transistor M2. The second conductive layer 4 includes a first conductive connection portion 41, and the first conductive connection portion 41 connects the first electrode 211 of the first transistor M1 and the first electrode 221 of the second transistor M2 through the first via hole K1 and the second via hole K2. With such design, while the first electrode 211 of the first transistor M1 is coupled to the first electrode 221 of the second transistor M2, the first electrode 211 of the first transistor M1 and the first electrode 221 of the second transistor M2 may be separated in the first conductive layer 2, which avoids a long interconnection line in the portion of the first conductive layer 2 located in the non-active area Q2, thereby suppressing the electromigration effect between the gate of the first transistor M1 and the interconnection line between the first electrode 211 of the first transistor M1 and the first electrode 221 of the second transistor M2. In this case, the metal ions (for example, aluminum ions) generated on the gate of the first transistor M1 will be reduced, thereby reducing the migration of metal ions on the gate of the first transistor M1 to the forward scan line VDS, and suppressing the electromigration effect between the first transistor M1 and the forward scan line VDS to a certain extent. Therefore, compared with the related art, in some embodiments of the present disclosure, the electromigration is less likely to occur between the first transistor M1 and the forward scan line VDS. That is, the black dots are less likely to appear between the first transistor M1 and the forward scan line VDS. Therefore, it is less likely to cause the channel of the active layer of the first transistor M1 to be abnormal, and the phenomenon of virtual short circuit or damage is less likely to occur between the first transistor M1 and the forward scan line VDS. Therefore, in a display device with the array substrate 10, the jitter horizontal stripe is less likely to appear in the active area of the display device due to the abnormal signal transmission, which improves a product yield.

For example, the distance L1 between the first electrode 211 of the first transistor M1 and the first electrode 221 of the second transistor M2 is in a range of approximately 5 μm to approximately 15 μm. Here, the term "approximately" means that the distance L1 may fluctuate up and down by ten percent. For example, the distance L1 between the first electrode 211 of the first transistor M1 and the first electrode 221 of the second transistor M2 may be 4.5 μm, 5 μm, 10 μm, 15 μm, or 16 μm.

In the examples, by setting the distance L1 between the first electrode 211 of the first transistor M1 and the first electrode 221 of the second transistor M2 to be in the range of approximately 5 μm to approximately 15 μm, the electromigration is less likely to occur between the first electrode 211 of the first transistor M1 and the first electrode 221 of the second transistor M2, and the phenomenon of virtual short circuit or damage is less likely to occur between the first electrode 211 of the first transistor M1 and the first electrode 221 of the second transistor M2, which is beneficial to improve the signal transmission quality, and improves the phenomenon that the jitter horizontal stripes appear in the active area of the display device.

Figure 7:
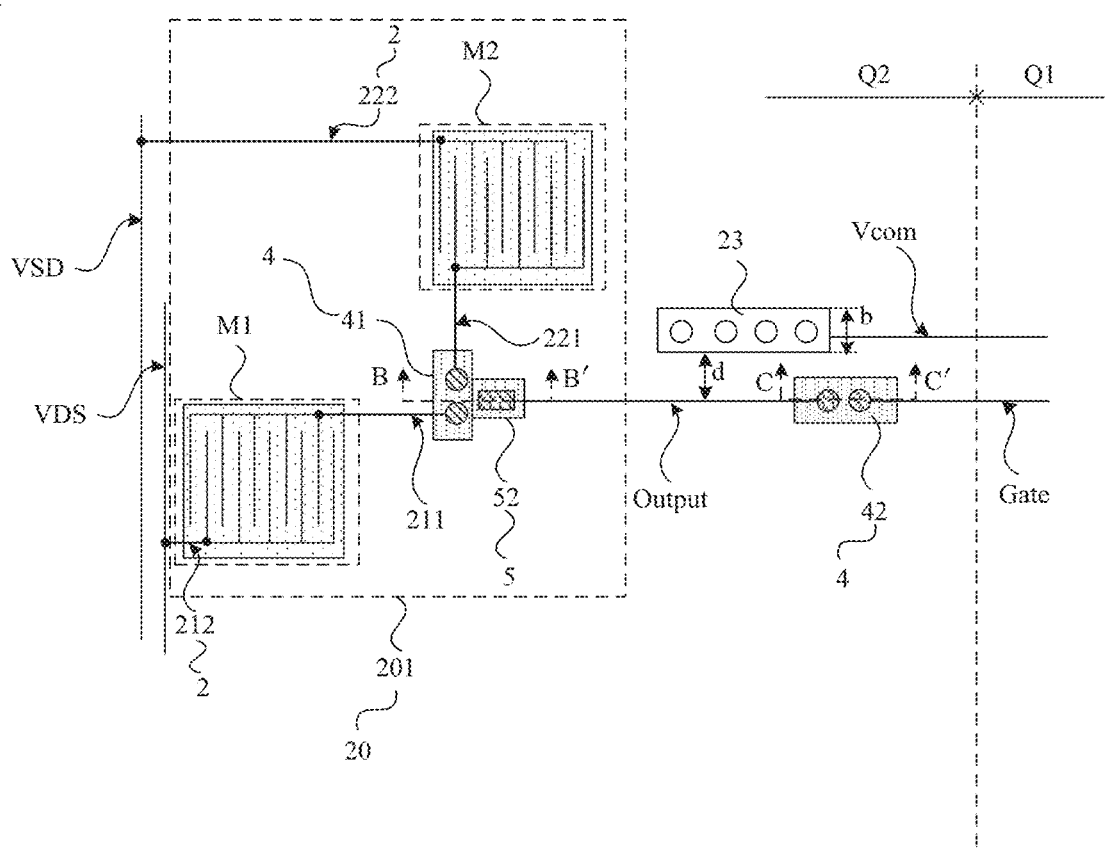
FIG. 7 is a structural diagram of another array substrate integrated with a gate driving circuit, in accordance with some embodiments of the present disclosure.

In some embodiments, as shown in FIG. 7, the portion of the first conductive layer 2 located in the non-active area Q2 further includes an output signal line Output and a common electrode block 23.

Figure 9:
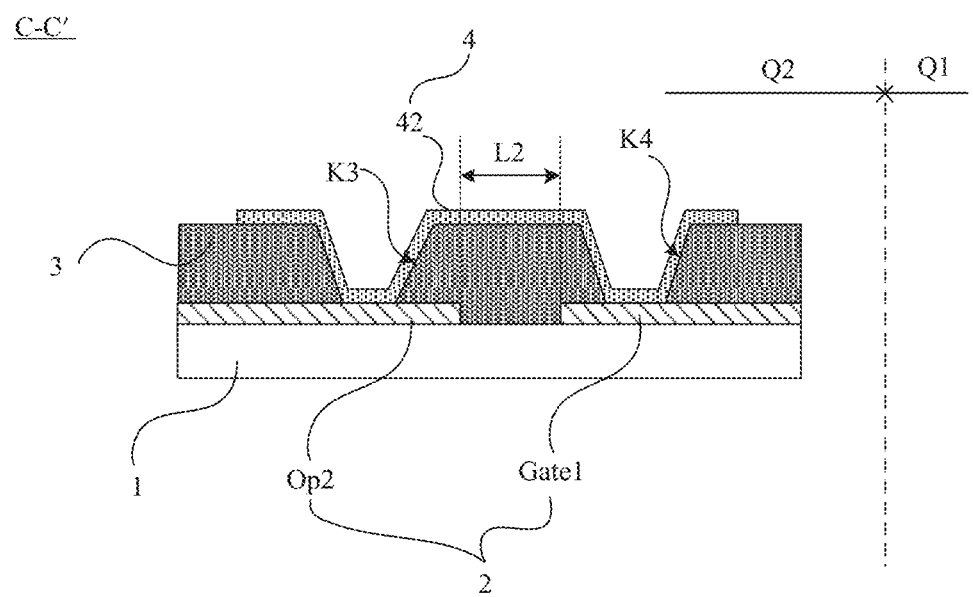
FIG. 9 is a sectional view of the array substrate integrated with the gate driving circuit in FIG. 7 at C-C'.

The output signal line Output has a first end away from the active area Q1 and a second end proximate to the active area Q1. The first end of the output signal line Output is coupled to a scanning signal output terminal of the shift register 201. The output signal line Output is configured to transmit a scanning voltage signal output by the scanning signal output terminal of the shift register 201. For example, as shown in FIGS. 7 and 9, the first conductive layer 2 further includes a gate line Gate. The gate line Gate extends from the active area Q1 to the non-active area Q2, and an end portion Gate1 of the gate line Gate located in the non-active area Q2 is coupled to the second end Op2 of the output signal line Output. Therefore, the output signal line Output may transmit the scanning voltage signal to the gate line Gate, and then drive the gate line Gate through the scanning voltage signal, so as to drive the display panel for display.

Figure 8:
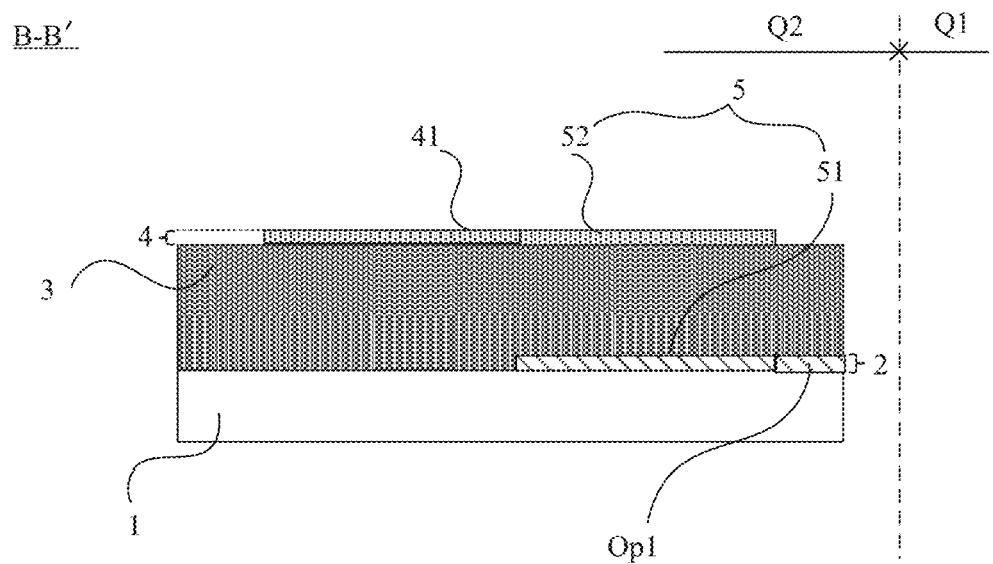
FIG. 8 is a sectional view of the array substrate integrated with the gate driving circuit in FIG. 7 at B-B'.

For example, referring to FIGS. 7 and 8, the shift register 201 further includes a capacitor 5, a first electrode 51 of the capacitor 5 is coupled to the scanning signal output terminal of the shift register 201 (in this case, as shown in FIG. 8, it is equivalent to that the first electrode 51 of the capacitor 5 is coupled to the first end Op1 of the output signal line Output), and a second electrode 52 of the capacitor 5 is coupled to the first conductive connection portion 41.

It will be noted that, the first electrode 51 of the capacitor 5 and the second electrode 52 of the capacitor 5 may be located in any two film layers of the array substrate 10. The embodiments do not limit a position of the first electrode 51 of the capacitor 5 and a position of the second electrode 52 of the capacitor 5. For example, as shown in FIG. 8, the first electrode 51 of the capacitor 5 is located in the first conductive layer 2, and the second electrode 52 of the capacitor 5 is located in the second conductive layer 4.

The common electrode block 23 is configured to transmit a common voltage signal. For example, as shown in FIG. 7, the first conductive layer 2 further includes a common voltage line Vcom, the common voltage line Vcom extends from the active area Q1 to the non-active area Q2, and an end portion of the common voltage line Vcom located in the non-active area Q2 is connected to the common electrode block 23. Therefore, the common electrode block 23 may transmit the common voltage signal to the common voltage line Vcom, and provide a common voltage to a light-emitting device in each pixel through the common voltage line Vcom, so that the display panel achieves a display function.

For example, as shown in FIG. 7, a distance d between the common electrode block 23 and the output signal line Output is in a range of about 22 μm to about 42 μm. Herein, the term "about" means that the distance d may fluctuate up and down by ten percent. For example, the distance d between the common electrode block 23 and the output signal line Output may be 20 μm, 22 μm, 32 μm, 40 μm, or 43 μm.

Figure 10:
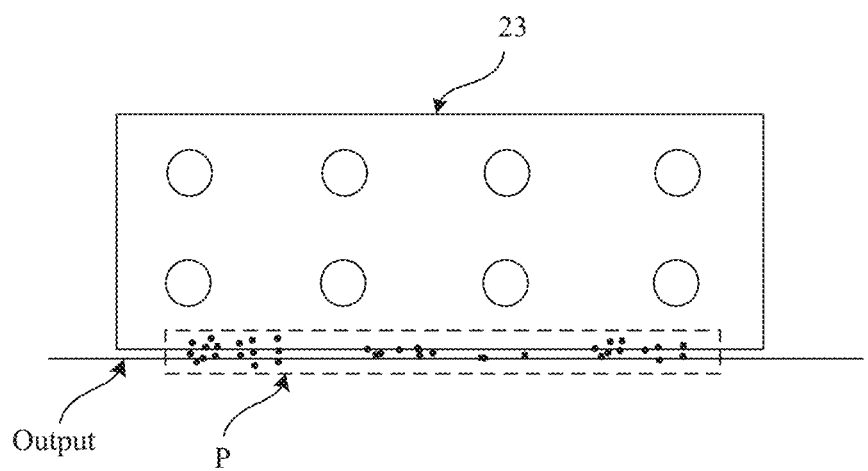
FIG. 10 is a structural diagram of another array substrate in the related art.

It is worth noting that, in the related art, the distance between the common electrode block 23 and the output signal line Output is 6 μm, and the common voltage line Vcom connected to the common electrode block 23 and the gate line Gate connected to the output signal line Output are both long lines. In this case, current intensity at the common electrode block 23 is large, as shown in FIG. 10, many black dots P appear between the common electrode block 23 and the output signal line Output. That is, the electromigration phenomenon described above is likely to occur between the common electrode block 23 and the output signal line Output, thereby causing abnormal signal transmission on the common electrode block 23 and the output signal line Output.

However, in some embodiments of the present disclosure, the distance d between the common electrode block 23 and the output signal line Output is in a range of about 22 μm to about 42 μm. Compared with the related art, in the embodiments, the distance d between the common electrode block 23 and the output signal line Output is increased, so that the electromigration phenomenon is less likely to occur between the common electrode block 23 and the output signal line Output. In this case, it will be noted that, in a case where the distance d between the common electrode block 23 and the output signal line Output approaches 42 μm, the electromigration may be effectively reduced. In a case where the distance d between the common electrode block 23 and the output signal line Output approaches 22 μm, the electromigration phenomenon between the common electrode block 23 and the output signal line Output is improved, and the wires of the peripheral driving circuits of the display device may be arranged more compact, which is beneficial to reduce a frame of the display device. In a case where the distance d between the common electrode block 23 and the output signal line Output approaches an intermediate value (e.g., 32 μm), the electromigration phenomenon between the common electrode block 23 and the output signal line Output may be better improved, and meanwhile, the wires of the peripheral driving circuits of the display device may be arranged more compact.

Referring to FIG. 7, compared with the related art, in some embodiments of the present disclosure, the distance d between the common electrode block 23 and the output signal line Output may be increased by reducing a dimension b of the common electrode block 23 in a direction parallel to the edge of the active area Q1. For example, in the embodiments, the dimension b of the common electrode block 23 in the direction parallel to the edge of the active area Q1 is in a range of about 60 μm to about 80 μm. It may be understood that, the term "about" here means that the distance b may fluctuate up and down by ten percent. For example, the dimension b may be 59 μm, 70 μm, or 82 μm.

It will be noted that, when a conductive line suddenly becomes wider or narrower (e.g., from the common electrode block 23 to the common voltage line Vcom, the conductive line becomes narrower), due to current crowding effect, current intensity at corners increases, which causes the electromigration phenomenon to be aggravated. In the embodiments, by reducing the dimension b of the common electrode block 23 in the direction parallel to the edge of the active area Q1, the current intensity at the corners may also be reduced, thereby more effectively improving the electromigration phenomenon.

In some embodiments, as shown in FIG. 9, the insulating layer 3 is provided with a third via hole K3 exposing the second end Op2 of the output signal line Output and a fourth via hole K4 exposing the end portion Gate1 of the gate line Gate located in the non-active area Q2. In this case, the second conductive layer 4 further includes a second conductive connection portion 42. The second conductive connection portion 42 connects the end portion Gate1 of the gate line Gate located in the non-active area Q2 and the second end Op2 of the output signal line Output through the third via hole K3 and the fourth via hole K4, so that the end portion Gate1 of the gate line Gate located in the non-active area Q2 is coupled to the second end Op2 of the output signal line Output. With such design, the portion of the first conductive layer 2 located in the non-display area Q2 does not have long lines connected to the gate line Gate, which is beneficial to improve the electromigration phenomenon.

For example, referring to FIG. 9, a distance L2 between the end portion Gate1 of the gate line Gate located in the non-active area Q2 and the second end Op2 of the output signal line Output is in a range of about 5 μm to about 15 μm. Herein, the term "about" means that the distance d may fluctuate up and down by ten percent. For example, the distance L2 between the end portion Gate1 of the gate line Gate located in the non-active area Q2 and the second end Op2 of the output signal line Output may be 4.5 μm, 5 μm, 10 μm, 15 μm, or 16 μm.

In the examples, by setting the distance L2 between the end portion Gate1 of the gate line Gate located in the non-active area Q2 and the second end Op2 of the output signal line Output to be in the range of about 5 μm to about 15 μm, the electromigration is less likely to occur between the end portion Gate1 of the gate line Gate located in the non-active area Q2 and the second end Op2 of the output signal line Output. As a result, the phenomenon of virtual short circuit or damage is less likely to occur between the end portion Gate1 of the gate line Gate located in the non-active area Q2 and the second end Op2 of the output signal line Output, which is beneficial to improve the signal transmission quality, and improves the phenomenon that the jitter horizontal stripe is prone to appear in the active area of the display device.

For example, a distance between any two of the first end Op1 of the output signal line Output, the first electrode 211 of the first transistor M1 and the first electrode 221 of the second transistor M2 is in a range of about 5 μm to about 15 μm. Herein, the term "about" means that the distance between any two of the above may fluctuate up and down by ten percent. For example, the distance between any two of the above may be 4.5 μm, 5 μm, 10 μm, 15 μm, or 16 μm. In the examples, by setting the distance between any two of the above to be in the range of about 5 μm to about 15 μm, the electromigration is less likely to occur between any two of the above. As a result, the phenomenon of virtual short circuit or damage is less likely to occur between any two of the above, which is beneficial to improve the signal transmission quality, and improves the phenomenon that the jitter horizontal stripe is prone to appear in the active area of the display device.

Figure 11:
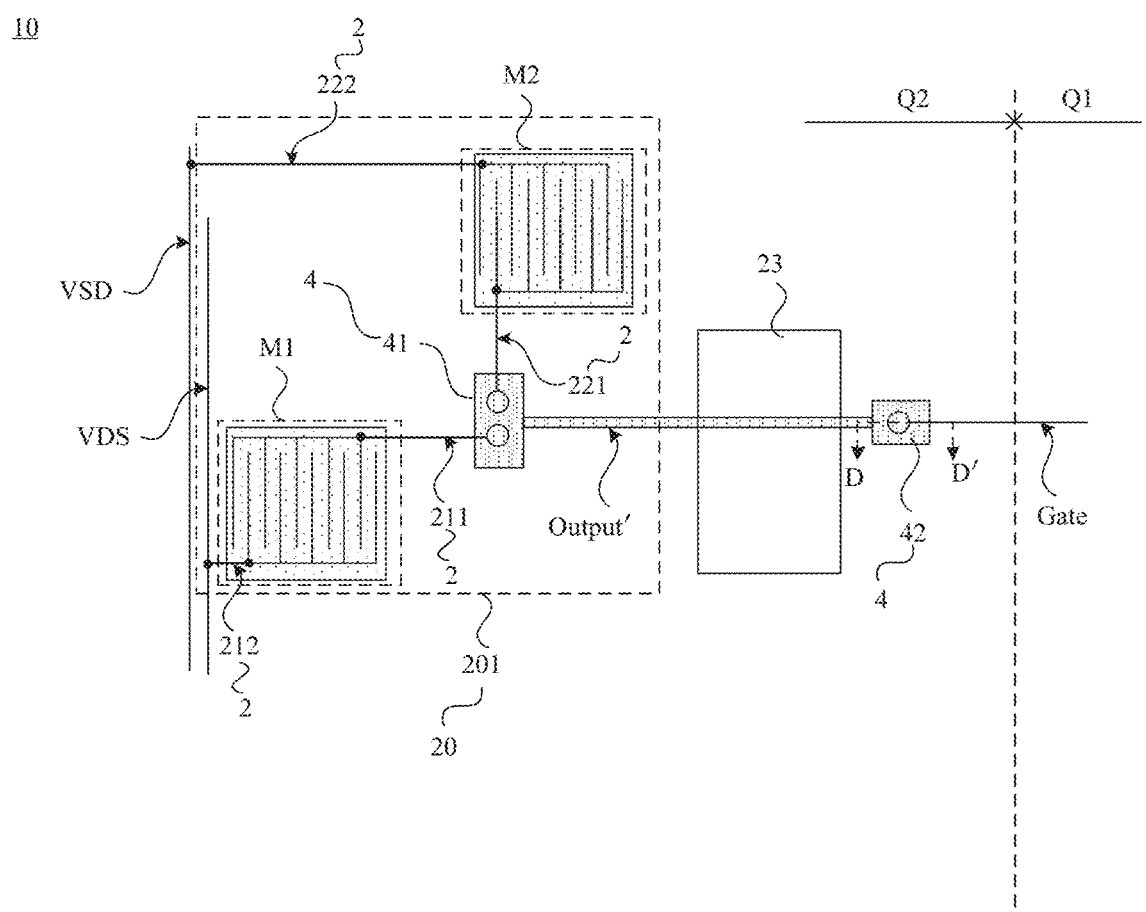
FIG. 11 is a structural diagram of yet another array substrate integrated with a gate driving circuit, in accordance with some embodiments of the present disclosure.

In some embodiments, as shown in FIG. 11, a portion of the second conductive layer 4 located in the non-active area Q2 further includes an output signal line Output'. It will be noted that, in the embodiments, the output signal line Output' in the second conductive layer 4 is substituted for the output signal line Output in the first conductive layer 2.

The output signal line Output' has a first end away from the active area Q1 and a second end proximate to the active area Q1. The first end of the output signal line Output' is coupled to the scanning signal output terminal of the shift register 201. For example, in this case, the capacitor is still coupled between the scanning signal output terminal of the shift register 201 and the first conductive connection portion 41. That is, it is equivalent to that the capacitor is coupled between the first end of the output signal line Output and the first conductive connection portion 41. Moreover, in this case, the first electrode of the capacitor and the second electrode of the capacitor are still located in two non-adjacent film layers, and the two non-adjacent film layers are not limited to the first conductive layer 2 and the second conductive layer 4.

On this basis, for example, as shown in FIG. 11, the common electrode block 23 may be disposed as a long line around the active area Q1. In this case, since the output signal line Output' and the common electrode block 23 are in different layers, the electromigration phenomenon will not occur between the output signal line Output' and the common electrode block 23.

Figure 12:
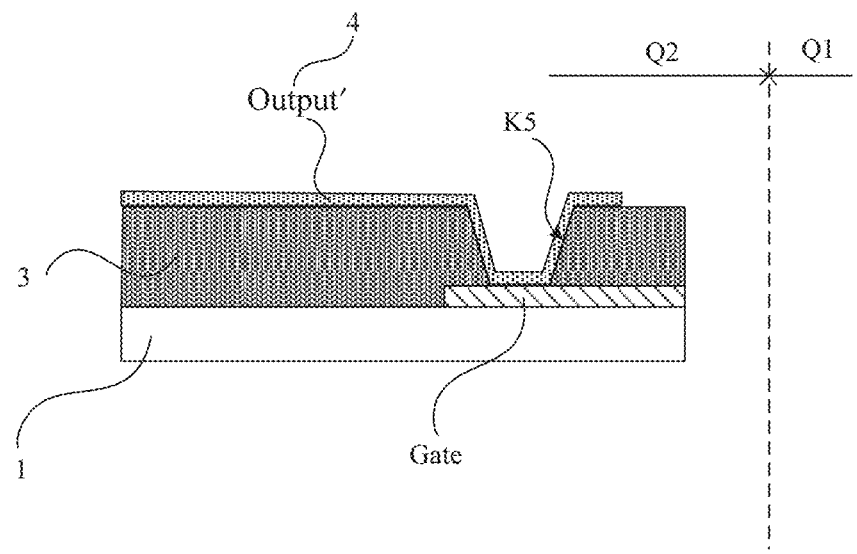
FIG. 12 is a cross-sectional view of the array substrate integrated with the gate driving circuit in FIG. 11 at D-D'.

For example, as shown in FIGS. 11 and 12, the first conductive layer 2 further includes the gate line Gate, and the gate line Gate extends from the active area Q1 to the non-active area Q2. The insulating layer 3 is provided with a fifth via hole K5 exposing the end portion of the gate line Gate located in the non-active area Q2, and the second end of the output signal line Output' is connected to the end portion of the gate line Gate located in the non-active area Q2 through the fifth via hole K5.

In some embodiments, referring to FIGS. 7 and 11, the portion of the first conductive layer 2 located in the non-active area Q2 further includes the second electrode 212 of the first transistor M1, the second electrode 222 of the second transistor M2, the forward scan line VDS and the reverse scan line VSD. The forward scan line VDS is disposed around the active area Q1, and the forward scan line VDS is disposed at a side of the gate driving circuit 20 away from the active area Q1. The reverse scan line VSD is disposed around the active area Q1, and the reverse scan line VSD is disposed at the side of the gate driving circuit 20 away from the active area Q1. The second electrode 212 of the first transistor M1 is connected to the forward scan line VDS; or the second electrode 222 of the second transistor M2 is connected to the reverse scan line VSD; or the second electrode 212 of the first transistor M1 is connected to the forward scan line VDS, and the second electrode 222 of the second transistor M2 is connected to the reverse scan line VSD. In the embodiments, when the second electrode 212 of the first transistor M1 is connected to the forward scan line VDS, and the second electrode 222 of the second transistor M2 is connected to the reverse scan line VSD, forward scan may be achieved by turning on the first transistor M1, and reverse scan may be achieved by turning on the second transistor M2.

Figure 13:
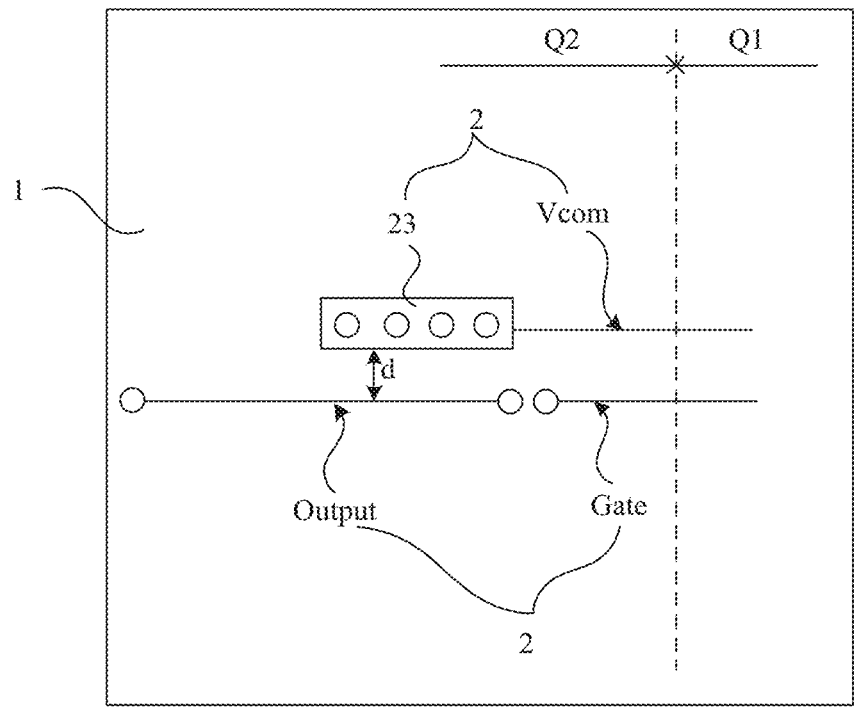
FIG. 13 is a structural diagram of yet another array substrate integrated with a gate driving circuit, in accordance with some embodiments of the present disclosure.

Referring to FIG. 13, some embodiments of the present disclosure provide another array substrate 10A. The array substrate 10A has an active area Q1 and a non-active area Q2 adjacent to the active area Q1. The array substrate 10A includes a base 1 and a first conductive layer 2 disposed at a side of the base 1. A portion of the first conductive layer 2 located in the non-active area Q2 includes at least an output signal line Output and a common electrode block 23. The output signal line Output is configured to transmit a scanning voltage signal, and the common electrode block 23 is configured to transmit a common voltage signal. A distance d between the common electrode block 23 and the output signal line Output is in a range of about 22 μm to about 42 μm. Herein, the term "about" means that the distance d may fluctuate up and down by ten percent. For example, the distance d between the common electrode block 23 and the output signal line Output may be 20 μm, 22 μm, 32 μm, 40 μm, or 43 μm.

In these embodiments, the distance d between the common electrode block 23 and the output signal line Output is in the range of about 22 μm to about 42 μm. Compared with the related art, in these embodiments of the present disclosure, the distance d between the common electrode block 23 and the output signal line Output is increased, so that the electromigration phenomenon is less likely to occur between the common electrode block 23 and the output signal line Output. In a case where the distance d between the common electrode block 23 and the output signal line Output approaches 42 μm, the electromigration may be effectively reduced. In a case where the distance d between the common electrode block 23 and the output signal line Output approaches 22 μm, the electromigration phenomenon between the common electrode block 23 and the output signal line Output is improved, and the wires of the peripheral driving circuits of the display device may be arranged more compact, which is beneficial to reduce the frame of the display device. In a case where the distance d between the common electrode block 23 and the output signal line Output approaches an intermediate value (e.g., 32 μm), the electromigration phenomenon between the common electrode block 23 and the output signal line Output may be better improved, and meanwhile, the wires of the peripheral driving circuits of the display device may be arranged more compact.

For example, as shown in FIG. 13, the first conductive layer 2 of the array substrate 10A further includes the gate line Gate and the common voltage line Vcom. The common voltage line Vcom may be directly coupled to the common electrode block 23, and the gate line Gate may be coupled to the output signal line Output through the second conductive connection portion (referring to the second conductive connection portion 42 shown in FIGS. 7 and 9).

Figure 14:
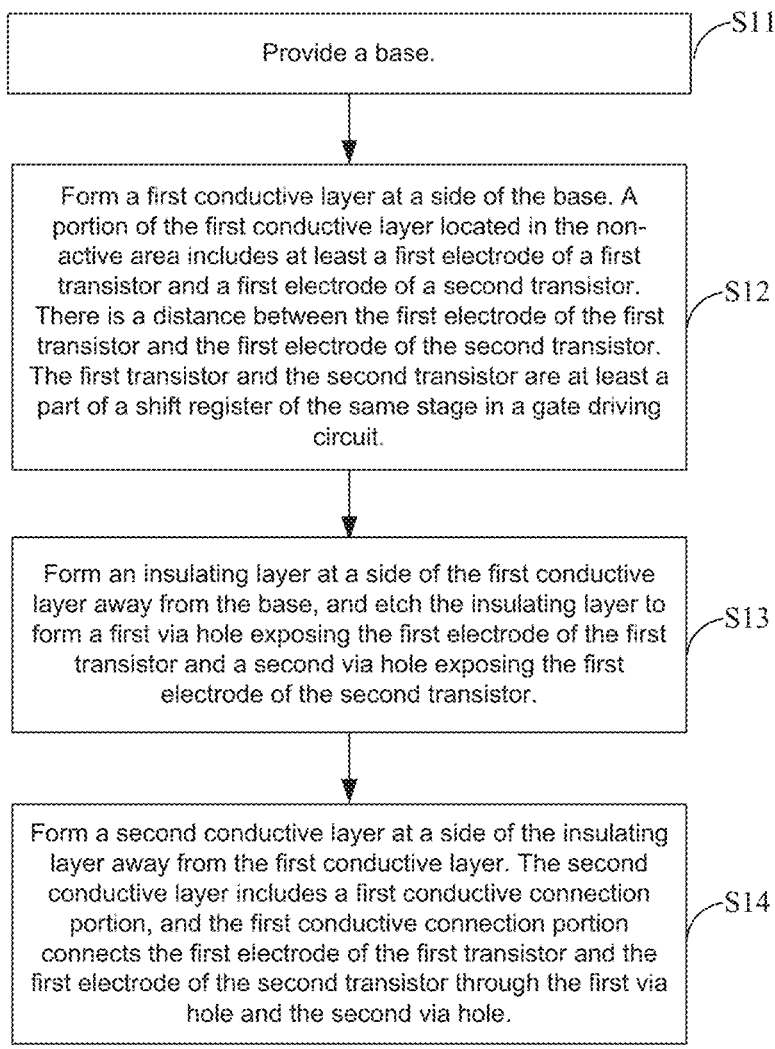
FIG. 14 is a flow diagram of a method for manufacturing an array substrate, in accordance with some embodiments of the present disclosure.

Some embodiments of the present disclosure provide a method for manufacturing the array substrate 10. Referring to FIGS. 5, 6 and 14, the array substrate 10 has the active area Q1 and the non-active area Q2 adjacent to the active area Q1. The manufacturing method includes the following steps.

In S11, a base 1 is provided.

In S12, a first conductive layer 2 is formed at a side of the base 1. A portion of the first conductive layer 2 located in the non-active area Q2 includes at least a first electrode 211 of a first transistor M1 and a first electrode 221 of a second transistor M2. There is a distance L1 between the first electrode 211 of the first transistor M1 and the first electrode 221 of the second transistor M2. The first transistor M1 and the second transistor M2 are at least a part of a shift register 201 of the same stage in a gate driving circuit 20.

In S13, an insulating layer 3 is formed at a side of the first conductive layer 2 away from the base 1, and the insulating layer 3 is etched to form a first via hole K1 exposing the first electrode 211 of the first transistor M1 and a second via hole K2 exposing the first electrode 221 of the second transistor M2.

In S14, a second conductive layer is formed at a side of the insulating layer away from the first conductive layer. The second conductive layer includes a first conductive connection portion, and the first conductive connection portion connects the first electrode of the first transistor and the first electrode of the second transistor through the first via hole and the second via hole.

In some embodiments of the present disclosure, the array substrate 10 manufactured through S11 to S14 achieves the coupling of the first electrode 211 of the first transistor M1 and the first electrode 221 of the second transistor M2, and the first electrode 211 of the first transistor M1 and the first electrode 221 of the second transistor M2 may be separated in the first conductive layer 2, which avoids the long interconnection line in the portion of the first conductive layer 2 located in the non-active area Q2, thereby reducing the probability of electromigration. Compared with the related art, the electromigration is less likely to occur between the first transistor M1 and the forward scan line VDS in the embodiments. That is, the black dots are less likely to appear between the first transistor M1 and the forward scan line VDS. As a result, it is less likely to cause the channel of the active layer of the first transistor M1 to be abnormal, and the phenomenon of virtual short circuit or damage is less likely to occur between the first transistor M1 and the forward scan line VDS. Therefore, in the display device with the array substrate 10, the jitter horizontal stripe is less likely to appear in the active area of the display device due to the abnormal signal transmission, which improves the product yield.

Figure 15:
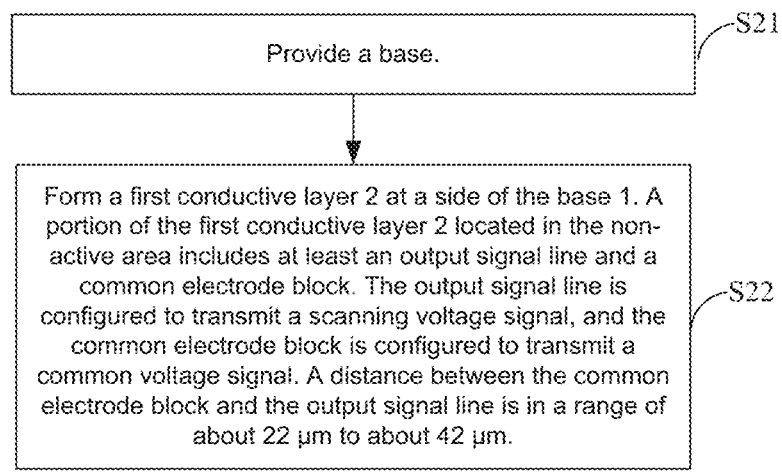
FIG. 15 is a flow diagram of a method for manufacturing another array substrate, in accordance with some embodiments of the present disclosure.

Some embodiments of the present disclosure provide a method for manufacturing another array substrate 10A. Referring to FIGS. 13 and 15, the array substrate 10A has an active area Q1 and a non-active area Q2 adjacent to the active area Q1. The manufacturing method includes the following steps.

In S21, a base 1 is provided.

In S22, a first conductive layer 2 is formed at a side of the base 1. A portion of the first conductive layer 2 located in the non-active area Q2 includes at least an output signal line Output and a common electrode block 23. The output signal line Output is configured to transmit a scanning voltage signal, and the common electrode block 23 is configured to transmit a common voltage signal. A distance between the common electrode block and the output signal line is in a range of about 22 μm to about 42 μm.

In some embodiments of the present disclosure, the array substrate 10A is manufactured through S21 and S22. Compared with the related art, the distance d between the common electrode block 23 and the output signal line Output is increased, so that the electromigration phenomenon is less likely to occur between the common electrode block 23 and the output signal line Output. In a case where the distance d between the common electrode block 23 and the output signal line Output approaches 42 μm, the electromigration may be effectively reduced. In a case where the distance d between the common electrode block 23 and the output signal line Output approaches 22 μm, the electromigration phenomenon between the common electrode block 23 and the output signal line Output is improved, and the wires of the peripheral driving circuits of the display device may be arranged more compact, which is beneficial to reduce the frame of the display device. In a case where the distance d between the common electrode block 23 and the output signal line Output approaches an intermediate value (e.g., 32 μm), the electromigration phenomenon between the common electrode block 23 and the output signal line Output may be better improved, and meanwhile, the wires of the peripheral driving circuits of the display device may be arranged more compact.

Figure 16:
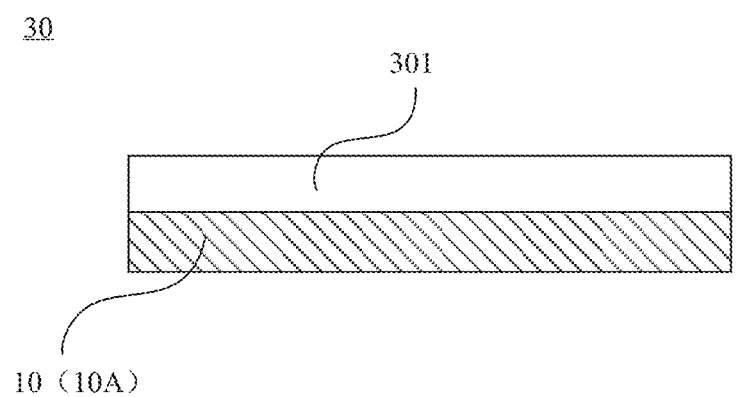
FIG. 16 is a structural diagram of a display panel, in accordance with some embodiments of the present disclosure.

Some embodiments of the present disclosure provide a display panel. As shown in FIG. 16, the display panel 30 includes the array substrate described in any of the above embodiments (e.g., the array substrate 10 or the array substrate 10A), and a transparent cover plate 301 disposed at a side of the array substrate.

For example, in a case where the display panel 30 is a liquid crystal display panel, the transparent cover plate 301 may be an opposing substrate arranged opposite to the array substrate. In this case, the display panel 30 further includes a liquid crystal layer disposed between the array substrate and the transparent cover plate 301.

The display panel 30 in some embodiments of the present disclosure includes the array substrate 10 or the array substrate 10A. Therefore, the display panel 30 has all the beneficial effects of the array substrate 10 or the array substrate 10A. For example, the display panel 30 effectively improves a situation that the jitter horizontal stripe is prone to occur.

Figure 17:
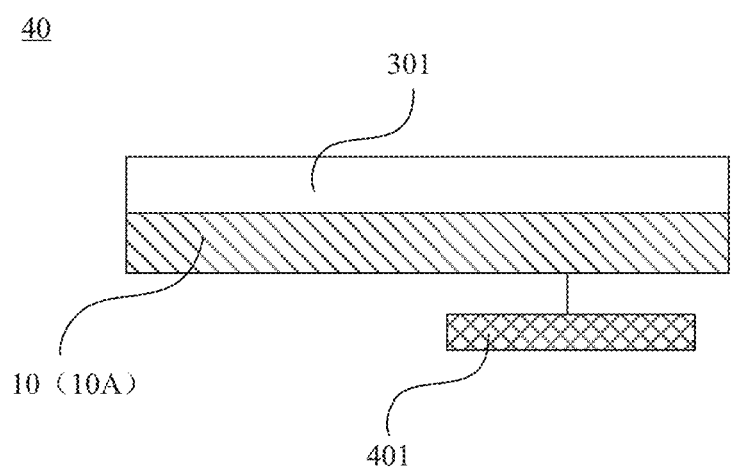
FIG. 17 is a structural diagram of a display device, in accordance with some embodiments of the present disclosure.

Some embodiments of the present disclosure provide a display device 40. As shown in FIG. 17, the display device 40 includes the display panel 30, and a power module 401. The power module 401 is coupled to the array substrate (i.e., the array substrate 10 or the array substrate 10A) in the display panel 30, and the power module 401 is configured to supply power to the array substrate, so that the display device 40 achieves the display function. Moreover, in the display device in some embodiments of the present disclosure, compared to the related art, the jitter horizontal stripe is less likely to appear.

For example, the display device 40 may be any product or component having a display function, such as a mobile phone, a tablet computer, a television, a display, a notebook computer, a digital camera, or a navigator.

The foregoing descriptions are merely specific implementation manners of the present disclosure, but the protection scope of the present disclosure is not limited thereto. Any person skilled in the art could conceive of changes or replacements within the technical scope of the present disclosure, which shall be included in the protection scope of the present disclosure. Therefore, the protection scope of the present disclosure shall be subject to the protection scope of the claims.

What is claimed is:

1. An array substrate having an active area and a non-active area adjacent to the active area; the array substrate comprising:
   a base;
   a first conductive layer disposed at a side of the base, a portion of the first conductive layer located in the non-active area including at least a first electrode of a first transistor and a first electrode of a second transistor, there being a distance between the first electrode of the first transistor and the first electrode of the second transistor, and the first transistor and the second transistor being at least a part of a shift register of a same stage in a gate driving circuit;
   an insulating layer disposed at a side of the first conductive layer away from the base, and the insulating layer being provided with a first via hole exposing the first electrode of the first transistor and a second via hole exposing the first electrode of the second transistor; and
   a second conductive layer disposed at a side of the insulating layer away from the first conductive layer, the second conductive layer including a first conductive connection portion, and the first conductive connection portion connecting the first electrode of the first transistor and the first electrode of the second transistor through the first via hole and the second via hole.

2. The array substrate according to claim 1, wherein the portion of the first conductive layer located in the non-active area further includes:
   an output signal line, and the output signal line having a first end away from the active area and a second end proximate to the active area; the first end of the output signal line being coupled to a scanning signal output terminal of the shift register; and
   a common electrode block, and the common electrode block being configured to transmit a common voltage signal; a distance between the common electrode block and the output signal line being in a range of about 22 μm to about 42 μm.

3. The array substrate according to claim 2, wherein the first conductive layer further includes:
   a common voltage line, the common voltage line extending from the active area to the non-active area, and an end portion of the common voltage line located in the non-active area being connected to the common electrode block; and
   a gate line, the gate line extending from the active area to the non-active area, and an end portion of the gate line located in the non-active area being coupled to the second end of the output signal line.

4. The array substrate according to claim 3, wherein the insulating layer is provided with a third via hole exposing the second end of the output signal line and a fourth via hole exposing the end portion of the gate line located in the non-active area; and
   the second conductive layer further includes:
   a second conductive connection portion, and the second conductive connection portion connecting the end portion of the gate line located in the non-active area and the second end of the output signal line through the third via hole and the fourth via hole, so that the end portion of the gate line located in the non-active area is coupled to the second end of the output signal line.

5. The array substrate according to claim 3, wherein a distance between the end portion of the gate line located in the non-active area and the second end of the output signal line is in a range of about 5 μm to about 15 μm; or
   a distance between any two of the first end of the output signal line, the first electrode of the first transistor and the first electrode of the second transistor is in a range of about 5 μm to about 15 μm; or
   a distance between the end portion of the gate line located in the non-active area and the second end of the output signal line is in a range of about 5 μm to about 15 μm, and a distance between any two of the first end of the output signal line, the first electrode of the first transistor and the first electrode of the second transistor is in a range of about 5 μm to about 15 μm.

6. The array substrate according to claim 2, wherein a dimension of the common electrode block in a direction parallel to an edge of the active area is in a range of about 60 μm to about 80 μm.

7. The array substrate according to claim 1, wherein a portion of the second conductive layer located in the non-active area further includes:
   an output signal line, and the output signal line having a first end away from the active area and a second end proximate to the active area; the first end of the output signal line being coupled to a scanning signal output terminal of the shift register.

8. The array substrate according to claim 7, wherein the first conductive layer further includes:
   a gate line, and the gate line extending from the active area to the non-active area; and
   the insulating layer is provided with a fifth via hole exposing an end portion of the gate line located in the non-active area, and the second end of the output signal line being connected to an end portion of the gate line located in the non-active area through the fifth via hole.

9. The array substrate according to claim 2, wherein the shift register includes:
   a capacitor disposed on the base, a first electrode of the capacitor being coupled to the scanning signal output terminal of the shift register, and a second electrode of the capacitor being coupled to the first conductive connection portion.

10. The array substrate according to claim 9, wherein one of the first electrode of the capacitor and the second electrode of the capacitor is located in the first conductive layer, and another is located in the second conductive layer.

11. The array substrate according to claim 1, wherein the portion of the first conductive layer located in the non-active area further includes:
    a second electrode of the first transistor;
    a second electrode of the second transistor;
    a forward scan line, the forward scan line being disposed around the active area, and the forward scan line being disposed at a side of the gate driving circuit away from the active area; and
    a reverse scan line, the reverse scan line being disposed around the active area, and the reverse scan line being disposed at the side of the gate driving circuit away from the active area; wherein
    the second electrode of the first transistor is connected to the forward scan line, or the second electrode of the second transistor is connected to the reverse scan line, or the second electrode of the first transistor is connected to the forward scan line and the second electrode of the second transistor is connected to the reverse scan line.

12. A method for manufacturing an array substrate, the array substrate having an active area and a non-active area adjacent to the active area, and the method comprising:
providing a base;
forming a first conductive layer at a side of the base, a portion of the first conductive layer located in the non-active area including at least a first electrode of a first transistor and a first electrode of a second transistor, there being a distance between the first electrode of the first transistor and the first electrode of the second transistor, and the first transistor and the second transistor being at least a part of a shift register of a same stage in a gate driving circuit;
forming an insulating layer at a side of the first conductive layer away from the base;
etching the insulating layer to form a first via hole exposing the first electrode of the first transistor and a second via hole exposing the first electrode of the second transistor; and
forming a second conductive layer at a side of the insulating layer away from the first conductive layer, the second conductive layer including a first conductive connection portion, and the first conductive connection portion connecting the first electrode of the first transistor and the first electrode of the second transistor through the first via hole and the second via hole.

13. A display panel, comprising:
the array substrate according to claim 1; and
a transparent cover plate disposed at a side of the array substrate.

14. A display device, comprising:
the display panel according to claim 13; and
a power module, the power module being coupled to the array substrate in the display panel, and the power module being configured to supply power to the array substrate.

15. The array substrate according to claim 4, wherein a distance between the end portion of the gate line located in the non-active area and the second end of the output signal line is in a range of about 5 μm to about 15 μm; or
a distance between any two of the first end of the output signal line, the first electrode of the first transistor and the first electrode of the second transistor is in a range of about 5 μm to about 15 μm; or
a distance between the end portion of the gate line located in the non-active area and the second end of the output signal line is in a range of about 5 μm to about 15 μm, and a distance between any two of the first end of the output signal line, the first electrode of the first transistor and the first electrode of the second transistor is in a range of about 5 μm to about 15 μm.

16. The array substrate according to claim 7, wherein the shift register includes:
a capacitor disposed on the base, a first electrode of the capacitor being coupled to the scanning signal output terminal of the shift register, and a second electrode of the capacitor being coupled to the first conductive connection portion.

17. The array substrate according to claim 16, wherein one of the first electrode of the capacitor and the second electrode of the capacitor is located in the first conductive layer, and another is located in the second conductive layer.

* * * * *